United States Patent [19]

Sasaki et al.

[11] Patent Number: 5,570,031
[45] Date of Patent: Oct. 29, 1996

[54] SUBSTRATE SURFACE POTENTIAL MEASURING APPARATUS AND PLASMA EQUIPMENT

[75] Inventors: Makoto Sasaki, Sendai; Hirofumi Fukui, Taiwa-machi; Masami Aihara, Sendai; Koichi Fukuda, Sendai; Yasuhiko Kasama, Sendai; Tadahiro Ohmi, 1-7 Yukigaya, Otsuka-Cho, Ota-ku, Tokyo, all of Japan

[73] Assignees: Frontec Incorporated; Tadahiro Ohmi, both of Sendai, Japan

[21] Appl. No.: 336,903

[22] Filed: Nov. 10, 1994

[30] Foreign Application Priority Data

Nov. 11, 1993 [JP] Japan .................................. 5-282724

[51] Int. Cl.$^6$ .......................... G01R 31/302; G01R 19/00
[52] U.S. Cl. .................................... 324/750; 324/158.1
[58] Field of Search ................................ 324/158.1, 750, 324/111; 156/345, 626, 627; 118/715, 728; 437/8

[56] References Cited

U.S. PATENT DOCUMENTS

| | | | |
|---|---|---|---|
| 2,412,191 | 12/1946 | Zottu | 324/111 |
| 2,607,528 | 8/1952 | McWhirter et al. | 324/111 |
| 2,997,651 | 8/1961 | Richeson, Jr. et al. | 324/111 |
| 3,071,688 | 1/1963 | Waddel | 324/111 |
| 3,243,701 | 3/1966 | Strand | 324/111 |
| 5,273,610 | 12/1993 | Thomas, III et al. | 156/627 |

FOREIGN PATENT DOCUMENTS 4-130723(A)  1/1992  Japan .

Primary Examiner—Ernest F. Karlsen
Attorney, Agent, or Firm—Guy W. Shoup; Patrick T. Bever

[57] ABSTRACT

There is provided a surface potential measuring apparatus cable of accurately measuring the potential of a substrate regardless of the material of the substrate, and a plasma equipment capable of accurately measuring and controlling ion energy. The substrate surface potential measuring apparatus measures the surface potential of a substrate in a plasma processing apparatus and includes a terminal electrically connected to a suscepter electrode for holding the substrate, a first condenser disposed between the terminal and the ground and a potential measuring device for measuring the potential of the terminal. The surface potential of the substrate is found from the potential of the suscepter electrode measured by the potential measuring means.

12 Claims, 5 Drawing Sheets

SUBSTRATE SURFACE POTENTIAL MEASURING APPARATUS AND PLASMA EQUIPMENT

BACKGROUND OF THE INVENTION

1. Field of the Invention

The present invention relates to a substrate surface potential measuring apparatus and a plasma processing apparatus, and more particularly, to a substrate surface potential measuring apparatus capable of measuring the surface potential of various kinds of substrates in a plasma processing apparatus and a plasma processing apparatus capable of accurately controlling ion energy.

2. Description of the Related Art

Plasma processing apparatus are widely used for forming various kinds of thin films and etching in a semiconductor production process. In order to positively utilize ions incident on a substrate and achieve processing of high reproducibility by using such processing apparatuses, it is very important to precisely measure and control the energy of the ions.

Ion energy is expressed as a difference between the plasma potential and the surface potential of a substrate. Although the plasma potential can be measured by using, for example, a Langmuir probe, a method of accurately and easily measuring the surface potential of the substrate has not been established yet. Therefore, various processes are performed by approximating the ion energy by the plasma potential and controlling the plasma potential.

However, since the surface potential of the substrate varies according to the material, thickness, set conditions and the like thereof, the ion energy cannot be accurately measured or determined using such method. As a result, for example, the quality of deposited films varies batch by batch, and this variation leads to a low yield of TFT substrates for liquid crystal displays.

SUMMARY OF THE INVENTION

It is an object of the present invention to provide a surface potential measuring apparatus capable of accurately measuring the potential of a substrate regardless of the material of the substrate, and a plasma equipment capable of accurately measuring and controlling ion energy.

According to an aspect of the present invention, there is provided a substrate surface potential measuring apparatus for measuring the surface potential of a substrate in a plasma processing apparatus and comprising a terminal electrically connected to a suscepter electrode for holding a substrate, a first condenser disposed between the terminal and the ground and a potential measuring means for measuring the potential of the terminal, wherein the surface potential of the substrate is found from the potential of the suscepter electrode measured by the potential measuring means.

It is preferable that the potential measuring means be comprised of a resistor, a selector switch, a second condenser and a voltmeter, the terminal be connected to the ground through the resistor, the selector switch and the second condenser, and the potential difference of the second condenser be measured in a state in which the second condenser is cut off from the resistor and is connected to the voltmeter by the selector switch.

It is preferable that the first condenser have a capacity which generally satisfies a series resonance condition relative to the plasma excitation frequency. A coil may be disposed in series with the first condenser as needed to satisfy the series resonance condition.

It is preferable that the resistance of the resistor be 100KΩ to 100MΩ, and the capacity of the second condenser be larger than that of the first condenser, that is, 500 pF to 1 µF. A preferable internal impedance of the voltmeter is above 1MΩ.

According to another aspect of the present invention, there is provided a plasma processing apparatus which can measure the surface potential of a substrate and in which a suscepter electrode for holding the substrate is connected to a terminal of the above substrate surface potential measuring apparatus.

According to still another aspect of the present invention, there is provided a plasma processing apparatus which can measure and control the surface potential of a substrate and in which a suscepter electrode for holding the substrate is connected to a terminal of the above substrate surface potential measuring apparatus, a radio-frequency power supply using a different frequency from a plasma excitation frequency is connected to the terminal, and a means for measuring the radio-frequency current flowing through the suscepter electrode is mounted.

It is preferable that at least a part of the suscepter electrode in contact with plasma be covered with an insulating material.

The operation of the present invention will be described.

The principle of measuring the potential of a substrate according to the present invention will be described by taking a plane parallel plasma processing apparatus as an example.

FIG. 1(a) is a conceptual view of a parallel plane plasma processing apparatus. Referring to FIG. 1(a), a suscepter electrode 102 and a upper electrode 105 are attached to the inside of a vacuum chamber 101 through insulators 110. The vacuum chamber 101 is provided with a gas supply line 106, a gas outlet 107 and other unillustrated valves to adjust its inside pressure to a predetermined pressure. A radio-frequency power supply 108 for plasma excitation is connected to the upper electrode 105 through a condenser 109 of a matching circuit. A part of the suscepter electrode 102 in contact with plasma has a coating 103 made of an insulating material thereon, and the suscepter electrode 102 is connected to a terminal 114 of a substrate surface potential measuring apparatus 111. Numerals 112 and 113 respectively denote a first condenser and a means of measuring the potential of the terminal 114 (that is, the potential of the suscepter electrode 102).

FIG. 1(b) illustrates an equivalent circuit on the side of the suscepter electrode 102. In the equivalent circuit, a capacity Cg of a glass substrate 104 and a capacity $C_1$ of the first condenser 112 are connected in series. Vg and Vs respectively denote the surface potential of the glass substrate 104 and the potential of the suscepter electrode 102.

When discharge is induced by applying radio-frequency power from the radio-frequency power supply 108 to the counter electrode 105, the surface potential Vg of the glass substrate 104 is determined by charged particles (ions and electrons) incident on the glass substrate 104.

In short, the glass substrate surface potential Vg equals $(C_1/Cg) \cdot Vs+Vs$ since $Cg \cdot (Vg-Vs)$ equals $C_1 \cdot Vs$. Therefore, Vg can be found by measuring Vs through the use of the known $C_1$ and Cg.

If an insulating film is formed all over the suscepter electrode 102, the capacity of the glass substrate 104 and the capacity of the insulating film are connected in series. In this case, although an accurate substrate potential can be found by making a correction to a contribution of the insulating film, the contribution can be neglected by, for example, decreasing the thickness of the insulating film, or selecting a material having a high dielectric constant as the insulating film. If the suscepter electrode 102 is in contact with plasma without being covered with any insulating film, since the suscepter electrode 102 and the glass substrate 104 have the same floating potential, the potential of the glass substrate 104 can be known by measuring the potential of the suscepter electrode 102.

Although the substrate is made of an insulating material like glass in the above description, a case in which the substrate is made of a conductive material like a silicon wafer will now be described. If an insulating film is formed on only a part of the suscepter electrode 102 in contact with plasma, or if the suscepter electrode 102 is in contact with plasma without any insulating film thereon, since the suscepter electrode 102 and the substrate 104 are electrically connected in series, the potential of the suscepter electrode 102 and the surface potential of the substrate 104 are equal to each other. Therefore, the surface potential of the substrate can be known by measuring the potential of the suscepter electrode 102. When an insulating film is formed all over the suscepter electrode 102, the capacity of the insulating film is measured in advance and the surface potential of the substrate is corrected according to the measured capacity.

An example of the suscepter electrode potential measuring means 113 is illustrated in FIG. 1(c). Referring to FIG. 1(c), the potential measuring means 113 is comprised of a second condenser 115, a voltmeter 116, a selector switch 117 and a resistor 118 with high impedance relative to radio frequency.

The selector switch 117 is normally set in a position $S_1$ (a state in which the second condenser 115 and the resistor 118 are connected), and shifted to a position $S_2$ at the time of measuring the potential (a state in which the second condenser 115 and the voltmeter 116 are connected). The value of the voltmeter 116 is lowered, simultaneously with the shift, by a time constant determined by the product of the internal impedance of the voltmeter 116 and the capacity of the second condenser 115. Since the voltage at the instant of shifting cannot be actually read, the change in voltage over time is extrapolated and the voltage at the shifting (that is, the time is zero) is found as a suscepter voltage.

In the example shown in FIG. 1(c), the voltage at shifting is found by using a CPU. In other words, a switch $S_3$ is disposed to specify a reference time for voltage measurement, and a predetermined voltage is inputted to the CPU by shifting the switch $S_3$ simultaneously with shifting the selector switch 117. The value of the voltmeter 116 which varies from the reference time at the time constant is inputted to the CPU through an interface, such as GP-IB, the changes of the voltage value over time are calculated by the CPU, and the voltage value at the reference time is calculated.

Values of the resistor 118 and the second condenser 115 are determined not to disturb plasma. Furthermore, it is preferable that the internal impedance of the voltmeter 116 and the capacity $C_2$ of the second condenser 115 respectively be above 1MΩ and 500 pF to 1 μF so that the time constant is approximately one second. In particular, a preferable internal impedance is 1 GΩ.

The capacity $C_1$ of the first condenser 112 is so designed to be a band-pass filter relative to the plasma excitation frequency, and its value is determined to generally satisfy a series resonance condition. Therefore, it is preferable that the first condenser 112 be a variable condenser. A preferable value of $C_1$ is about 1 pF to 100 pF. A coil may be disposed in series with the first condenser 112 as necessary in order to generally satisfy the series resonance condition.

A plasma apparatus capable of freely controlling the potential of a substrate, that is, freely controlling ion energy will be described with reference to FIG. 2. FIG. 2 illustrates a so-called dual-frequency excitation plasma processing apparatus. In this plasma equipment as distinct from a single-frequency excitation plasma equipment shown in FIG. 1, a plasma potential monitor 122 disclosed in, for example, Japanese Patent Application No. 2-252847 is added, and a suscepter electrode 102 is connected to a radio-frequency power supply 119 for applying radio-frequency power through a condenser 120 of a matching circuit. The radio-frequency power supply 119 uses a different frequency from that of a radio-frequency power supply 108 for plasma excitation. Furthermore, a radio-frequency current measuring means 121 is interposed between the suscepter electrode 102 and a first condenser 112. As the radio-frequency current measuring means 121, a normal radio-frequency ammeter is used.

In order to measure the surface potential of a substrate, power is first applied from the first radio-frequency power supply 108 to a upper electrode 105 in a state in which the substrate is not laid on the suscepter electrode 102, thereby inducing discharge. Then, power is applied from the second radio-frequency power supply 119 to the suscepter electrode 102 and the potential of the suscepter electrode 102 which is a self-bias potential is measured in the above-mentioned method. Subsequently, a substrate 104 is laid on the suscepter electrode 102 and a current i flowing through the suscepter electrode 102 (that is, flowing through the substrate 104) is measured.

A surface voltage Vg of the substrate is shifted by ΔV from a potential Vs of the suscepter electrode 102 as shown in the following expressions.

$$Vg=Vs+\Delta V$$

$$\Delta V=|Z|\times |i|$$

where
 i: radio-frequency current flowing through substrate
 Z: impedance of substrate (Z=1/jwC, C=εs/d)
 ε: dielectric constant of substrate
 S: area of substrate
 d: thickness of substrate When an insulating film is formed all over the suscepter electrode, a correction is made by a capacity of the insulating film.

The potential of the substrate can be freely changed by changing the radio-frequency current i flowing through the substrate, specifically, the radio-frequency power.

On the other hand, if the substrate is conductive, since the suscepter electrode and the substrate are electrically connected in series, they have the same potential. Therefore, the potential of the substrate can be measured by measuring the potential of the suscepter electrode. Plasma processing apparatus are classified into, for example, sputtering apparatus, PCVD apparatus, dry etching apparatus and ashing apparatus according to their intended purpose, and further classified into, for example, parallel plane, microwave, inductive coupling and circularly polarized apparatus according to the plasma excitation method performed by the plasma processing apparatus.

The suscepter electrode of the present invention is made of a conductive material, preferably, Al, SUS and the like. Although the insulator covering the suscepter electrode may be made of any material which insulates direct current, the material is required not to pollute the plasma atmosphere, the substrate and so on. For example, $SiO_2$, $Si_3N_4$ and $Al_2O_3$ are suitably used. If the insulating film is formed all over the suscepter electrode, as mentioned above, it is preferable that the thickness of the insulating film be small enough to be neglected relative to the capacity of the insulating substrate when the insulating film is connected to the substrate in series, for example, 50 nm to 100 μm, and more preferably, 100 nm to 1 μm.

In order to cover only a part of the suscepter electrode in contact with plasma with an insulating material, for example, a ceramic coating having a thickness of approximately 1 mm and a hole of identical shape with the substrate is applied onto the suscepter electrode, or the suscepter electrode is covered with an insulating material from the outermost periphery of the substrate.

DESCRIPTION OF THE PREFERRED EMBODIMENTS

Although the present invention is described in detail with reference to preferred embodiments, it is not limited to these embodiments.

Embodiment 1

Figure 1A:
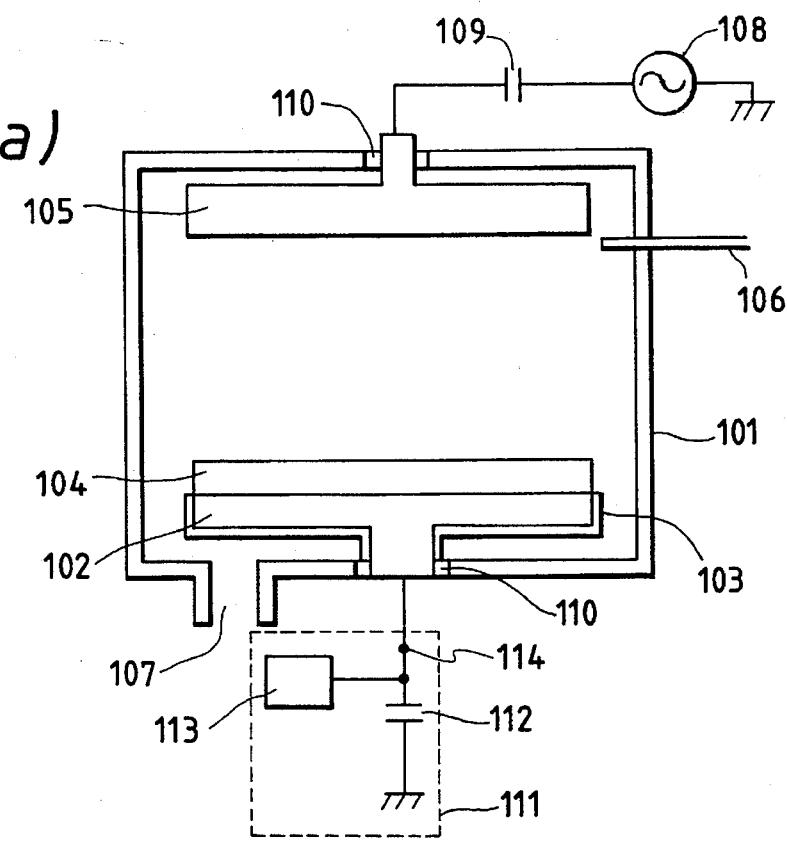
FIGS. 1(a), 1(b), and 1(c) are conceptual views showing an example of a plasma equipment and an equivalent circuit diagram of a surface potential measuring apparatus according to the present invention.
Figure 1B:
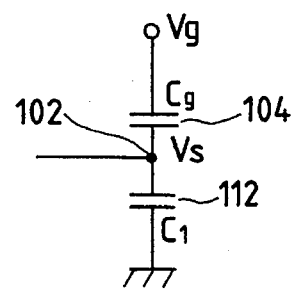
Figure 1C:
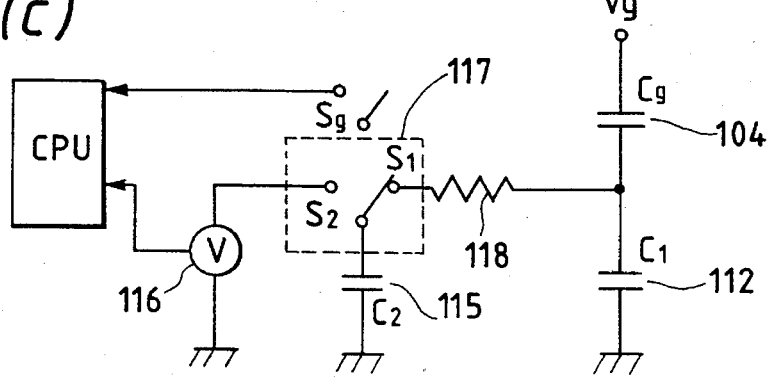
Figure 2:
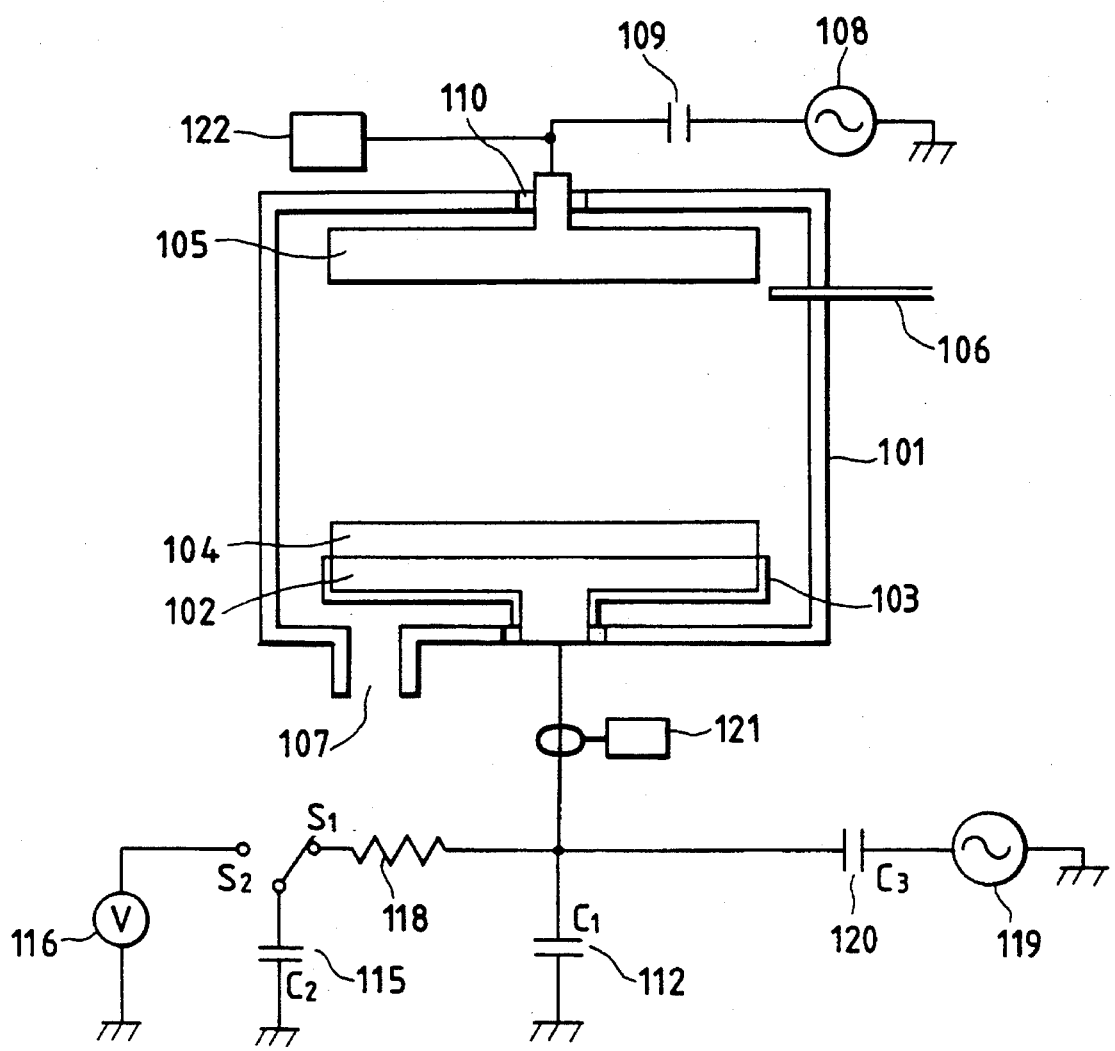
FIG. 2 is a conceptual view showing an example of a plasma equipment capable of controlling the surface potential of a substrate according to the present invention.

By using the plasma equipment shown in FIG. 2, an Ar gas was led from a gas supply line 106 into a vacuum chamber 101 and exhausted from an outlet 107 to keep the pressure inside the vacuum chamber 101 at 10 mTorr, 100 W of radio-frequency power at 100 MHz was applied from the radio-frequency power supply (RF1) 108 to the upper electrode 105 to cause discharge, and 0 to 10 W of radio-frequency power at 13.56 MHz was applied from the radio-frequency power supply (RF2) 119 to the suscepter electrode 102 (made of SUS 316).

After the potential of the suscepter electrode 102 at each power was measured by a voltmeter 116 in the above-mentioned manner, a glass substrate 104 is placed so that a metal portion of the suscepter electrode 102 is not brought in contact with plasma, discharge is caused by injecting an Ar gas in the same manner as above, and a bias is applied from the radio-frequency power supply RF2. In this embodiment, $C_1$ was 5 pF, $C_2$ was 100 pF, a resistance was 1MΩ, and the internal impedance of the voltmeter 116 was 1 GΩ.

The radio-frequency current i flowing through the glass substrate 104 was measured by a radio-frequency ammeter 121 (Royal-RF20 from Royal), and ΔV was found from the capacity of the glass substrate 104 found in advance and the radio-frequency current i. The found values are indicated by a solid line and an alternate long and two short dashes line shown in FIG. 3.

On the other hand, aside from the present invention, a Cr film of 1 μm was formed on the surface of a glass substrate, and the surface potential of the substrate was directly measured by connecting the Cr film and a lead wire and pulling the Cr film out. The measurement result is shown as a comparative example in FIG. 3.

Figure 3:
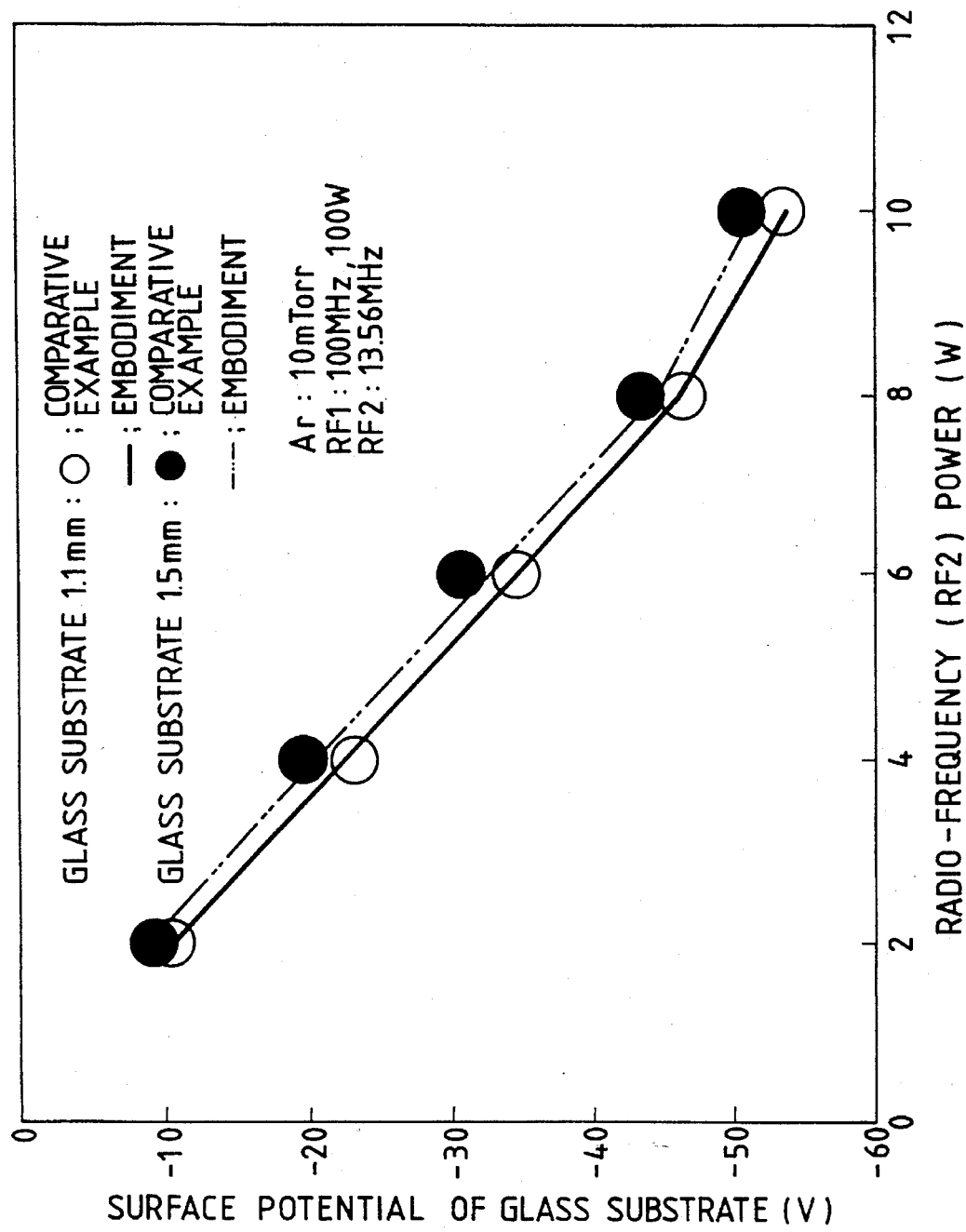
FIG. 3 is a graph showing the relationship between the surface potential of a glass substrate and radio-frequency power.

As FIG. 3 reveals, when the thickness of the glass substrate was 1.1 mm or 1.5 mm, the measurement result of this embodiment is similar to that of the comparative example in which the potential of the Cr film was directly measured. in short, it is revealed that the surface potential of the substrate can be measured precisely and easily according to the present invention.

FIG. 3 also reveals that the surface potential of the substrate can be adjusted to an arbitrary value by changing the radio-frequency power to be applied to the suscepter electrode.

Figure 4:
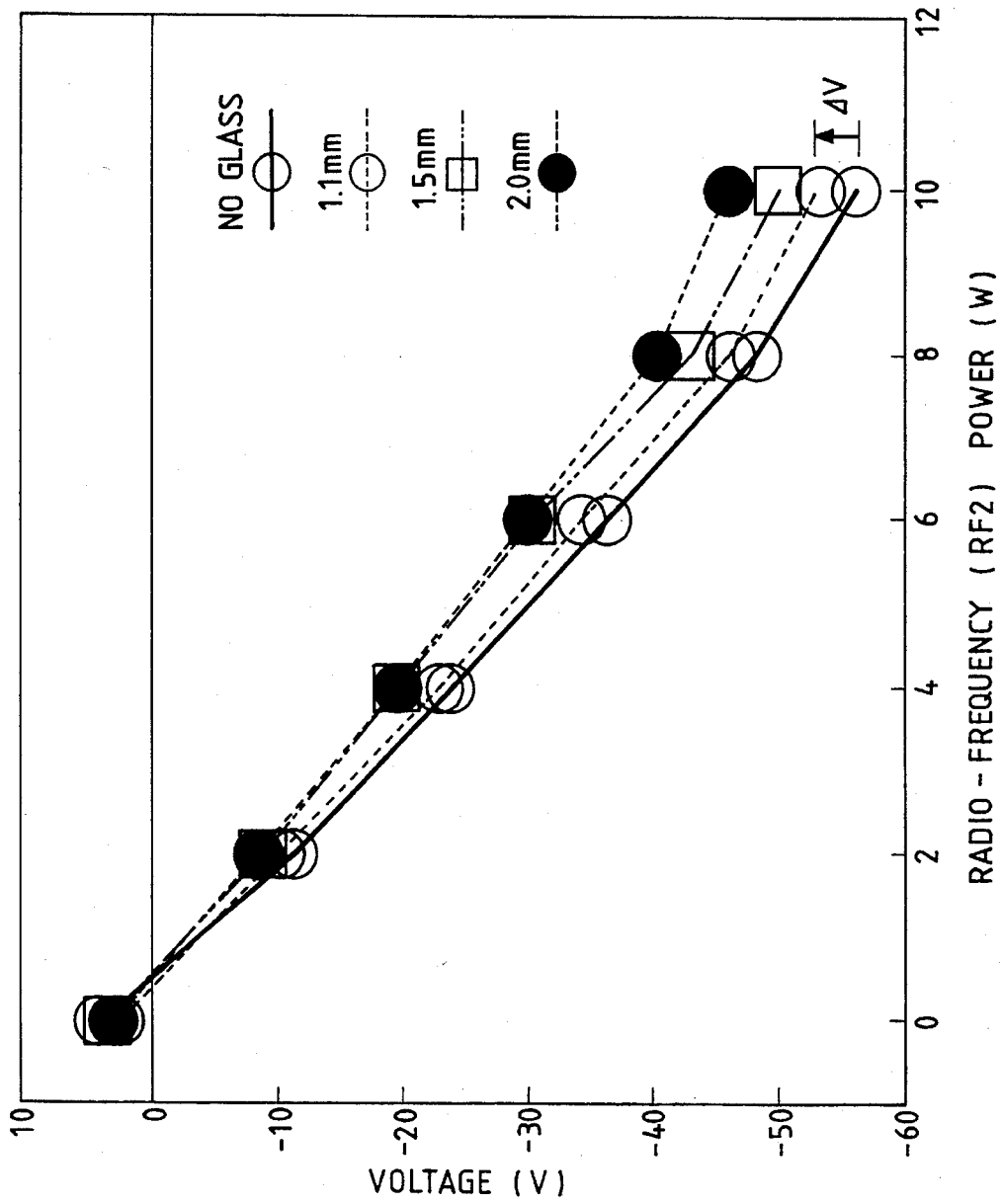
FIG. 4 is a graph showing the relationship between the thickness and the surface potential of the glass substrate.
Figure 5:
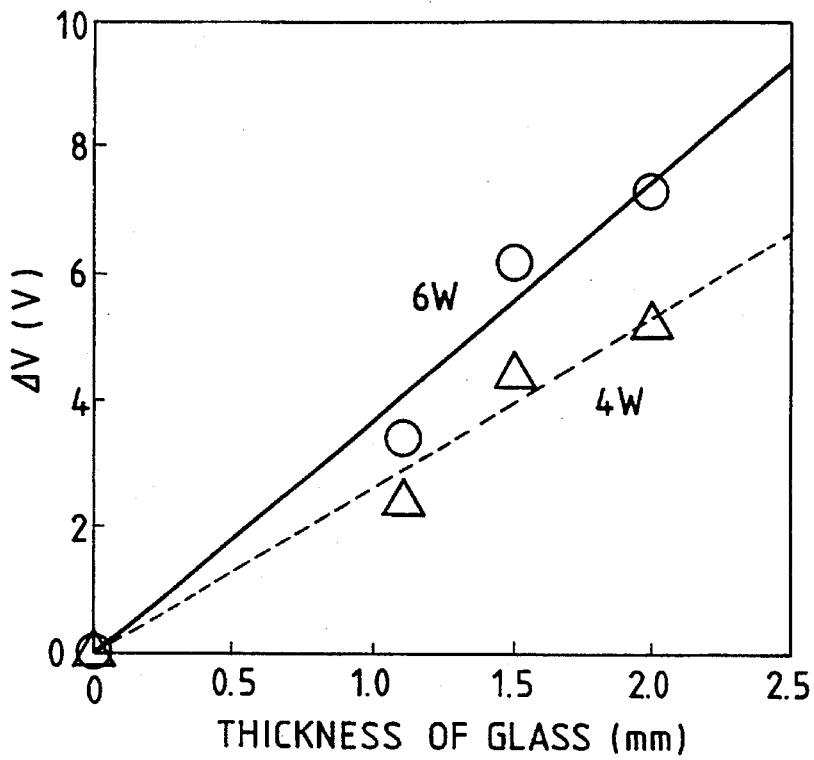
FIG. 5 is a graph showing the relationship between the thickness of the glass substrate and ΔV.

Measurement results showing the relationships among the thickness of the glass substrate, the radio-frequency power, the surface potential of the substrate and ΔV are shown in FIGS. 4 and 5. The measurement conditions, such as discharge, are the same as those shown in FIG. 3. These figures also reveal that the surface potential is increased by increasing the radio-frequency power, and decreased by increasing the thickness of the glass substrate.

Embodiment 2

The substrate potential measuring apparatus of the present invention is mounted in a sputtering apparatus, a film of aluminum was formed, and the relationship between ion energy and the resistivity of the aluminum film was examined. The sputtering apparatus was of the dual-frequency excitation type similar to the equipment shown in FIG. 2. Ion energy was changed by changing the thickness of the glass substrate. The Ar pressure was 10 mTorr, the plasma excitation radio frequency RF1 was 100 MHz and 100 W, and the radio frequency RF2 for bias was 13.56 MHz and 4 W.

Figure 6:
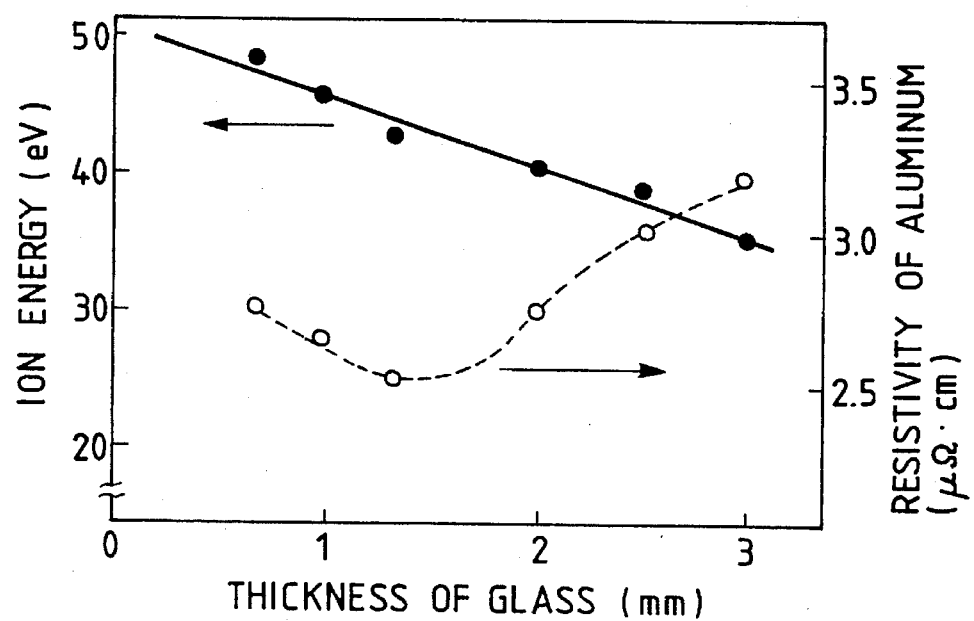
FIG. 6 is a graph showing the relationship between the thickness of the glass substrate (ion energy) and the resistivity of aluminum.

It is clear from the result of examination shown in FIG. 6 that the resistivity of aluminum takes its minimum value according to ion energy (thickness of glass).

According to the plasma equipment of the present invention, since it is possible to measure the surface potential of the substrate with precision and to freely change the surface potential, when a conductive film, an insulating film, a semiconductor film and the like was formed on a substrate, such as a glass substrate and a silicon wafer, ion energy can be controlled as needed and the film can be of stable quality. As a result, it is possible to produce a device, such as a TFT substrate for a liquid crystal display, with high stability and reproducibility. Furthermore, in, for example, reactive ion etching, since ion energy can be precisely controlled, anisotropic etching, selective etching and the like can be performed without causing any damage to the substrate.

What is claimed is:

1. A substrate surface potential measuring apparatus for measuring a surface potential of a substrate located in a plasma processing apparatus, the plasma processing apparatus including a suscepter electrode mounted in a plasma chamber, the substrate being mounted on the suscepter electrode, the substrate surface potential measuring apparatus comprising:

a terminal electrically connected to the suscepter electrode;

a first condenser electrically connected between said terminal and ground; and potential measuring means connected between said terminal and said condenser for measuring the potential of said suscepter electrode, wherein the surface potential of said substrate is determined from the potential of said suscepter electrode measured by said potential measuring means.

2. A substrate surface potential measuring apparatus according to claim 1, wherein said potential measuring means comprises a resistor having a first end connected to the terminal and a second end, a voltmeter, a second condenser, and a selector switch having a fixed portion connected to ground through the second condenser and a movable portion adjustable to connect the second condenser to one of the second end of the resistor and the voltmeter, and the potential difference of said second condenser is measured in a state in which said second condenser is cut off from said resistor and is connected to said voltmeter by said selector switch.

3. A substrate surface potential measuring apparatus according to claim 2, wherein said first condenser has a capacity which generally satisfies a series resonance condition relative to a plasma excitation frequency.

4. A substrate surface potential measuring apparatus according to claim 3, wherein a coil is disposed in series with said first condenser.

5. A substrate surface potential measuring apparatus according to claim 2, wherein a resistance of said resistor is within a range of 100KΩ to 100MΩ.

6. A substrate surface potential measuring apparatus according to claim 2, wherein a capacity of said second condenser is larger than a capacity of said first condenser.

7. A substrate potential measuring apparatus according to claim 6, wherein the capacity of said second condenser is in a range of 500 pF to 1 μF.

8. A substrate potential measuring apparatus according to claim 2, wherein an internal impedance of said voltmeter is equal to or greater than 1MΩ.

9. A substrate potential measuring apparatus according to claim 1, wherein said substrate is made of an insulating material.

10. A plasma generating apparatus for processing a surface of a substrate located therein, the plasma generating apparatus comprising:

a suscepter electrode for holding said substrate; and a substrate surface potential measuring device including:

a terminal electrically connected to the suscepter electrode;

a first condenser disposed between said terminal and ground; and potential measuring means connected between said terminal and said first condenser for measuring a potential of said suscepter electrode, wherein a surface potential of said substrate is determined from the potential of said suscepter electrode measured by said potential measuring means.

11. A plasma generating apparatus according to claim 10, wherein at least a part of said suscepter electrode in contact with plasma is covered with an insulating material.

12. A plasma generating apparatus according to claim 10, further comprising:

a radio-frequency power supply using a different frequency from a plasma excitation frequency, the radio-frequency power supply being connected to said terminal, and means for measuring the radio-frequency current flowing through said suscepter electrode.

* * * * *